(12) United States Patent
Tsuda

(10) Patent No.: US 6,469,940 B1
(45) Date of Patent: Oct. 22, 2002

(54) MEMORY ACCESS METHOD AND SYSTEM FOR WRITING AND READING SDRAM

(75) Inventor: Hiroki Tsuda, Tokyo (JP)

(73) Assignee: NEC Corporation, Tokyo (JP)

( * ) Notice: Subject to any disclaimer, the term of this patent is extended or adjusted under 35 U.S.C. 154(b) by 45 days.

(21) Appl. No.: 09/618,282

(22) Filed: Jul. 18, 2000

(30) Foreign Application Priority Data

Jul. 22, 1999 (JP) ............................................ 11-207126

(51) Int. Cl.[7] .............................................. G06F 12/00
(52) U.S. Cl. ............................ 365/189.05; 365/189.01; 365/191; 710/35
(58) Field of Search ...................... 711/104; 365/189.01, 365/189.05, 194, 230.03; 710/34, 35

(56) References Cited

U.S. PATENT DOCUMENTS

| | | | | |
|---|---|---|---|---|
| 4,748,627 A | * | 5/1988 | Ohsawa | 365/222 |
| 5,657,269 A | * | 8/1997 | Nanamiya | 365/185.17 |
| 5,813,023 A | | 9/1998 | McLaury | 711/105 |
| 5,903,509 A | | 5/1999 | Ryan et al. | 365/230.03 |
| 6,262,938 B1 | * | 7/2001 | Lee et al. | 365/194 |
| 6,339,560 B1 | * | 1/2002 | Naritake | 365/189.01 |

FOREIGN PATENT DOCUMENTS

| | | |
|---|---|---|
| JP | 10-233091 | 9/1998 |
| JP | 2000-187982 | 7/2000 |
| JP | 2000-231788 | 8/2000 |

* cited by examiner

Primary Examiner—B. James Peikari
(74) Attorney, Agent, or Firm—Sughrue Mion, PLLC

(57) ABSTRACT

A memory access method and system which solve the problems of degradation of data transfer efficiency due to memory access waiting period and complexity of memory interface. The system has an address buffer for reading an address in synchronization with a clock, and a burst counter which generates an address of burst length. Further, a ROW address register adjusts timing by latching a ROW address, and similarly a COLUMN address register adjusts timing by latching a COLUMN address. A ROW address decoder decodes the ROW address while a COLUMN address decoder sets the decodes the COLUMN address. The system also includes a mode register which sets the operation mode of the DRAM and a command decoder which interprets and discriminates a command signal. Finally, a controller controls the operation of the overall DRAM, and a memory array holds data for use with a data input/output buffer for data transmission/reception.

7 Claims, 5 Drawing Sheets

MEMORY ACCESS METHOD AND SYSTEM FOR WRITING AND READING SDRAM

BACKGROUND OF THE INVENTION

1. Field of the Invention

The present invention relates to a memory access method and system and, more particularly, to a memory access method and system for writing and reading with respect to a synchronous dynamic random access memory (SDRAM) and control thereof.

2. Description of Related Art

Generally, a dynamic random access memory (DRAM) with a simple information storage structure has a memory capacity larger than that of a static random access memory (SRAM)

However, upon random writing/reading access, as a ROW address and a COLUMN address are set in a time-multiplexing manner, the data transfer speed is low.

Accordingly, if a high data transfer speed is required, a synchronous type DRAM (SDRAM) which realizes high-speed access by pipeline processing is utilized. When accessing a page having the same ROW address, an access speed equivalent to that of SRAM can be attained.

However, since the SDRAM is based on the DRAM basic operation, if writing with the same ROW address changes to reading or if writing/reading to/from some page is made and then writing/reading is made to/from another page, there is a period where the data bus is not effectively used, and the data transfer efficiency is lowered.

Besides the lowered efficiency, another problem occurs in continuous random access systems. Specifically, waiting periods that occur upon access to a memory require the use of temporary storage elements, which complicates the design of the memory interface.

These problems will be described in more detail below.

FIG. 4 is a block diagram showing a well-known SDRAM (Synchronous DRAM). In this SDRAM, a command decoder 9 determines the type of command by a command signal d input to the memory device. If the command decoder 9 interprets the command as a "row address setting signal" (ACT), an input address c is latched.

However, if the command decoder 9 interprets the command as a "writing (WR)" or "reading (RD)" signal, the input address c is latched in the address buffer 2, and then output to a COLUMN address decoder 7.

Further, if the command decoder 9 interprets the command as a "mode setting" signal, the input address c is latched in the address buffer 2, and then output to a mode register 8.

A control signal generator 10 generates a control signal based on the setting of the mode register 8 to operate respective elements of the DRAM based on the condition of the mode register 8, thus controlling the respective elements of the DRAM, i.e., the address buffer 2, a burst counter 3, the ROW address decoder 6, the COLUMN address decoder 7 and a data controller 16.

Parameters set in the mode register 8 include a burst length and a burst address reading order are set to determine the operation condition for the burst counter 3.

After the power is turned on, the burst length and the burst address reading order are set through the address buffer 2 based on an address signal input a. The control signal generator 10 controls the burst counter 3 in accordance with the set burst length and the burst address reading order.

The burst counter 3 generates a series of addresses for the burst transfer from the input address in accordance with the burst length and the burst address reading order controlled by the control signal generator 10, and outputs the series of addresses through the address buffer 2 to the ROW address decoder 6.

The ROW address decoder 6 and the COLUMN address decoder 7 decode a ROW address and a COLUMN address respectively inputted from the address buffer 2, and select a memory cell to/from which data is to be written or read, from a memory array 11.

The control signal generator 10 controls the data controller 16 using the control signal generated from the input command of the command decoder 9, to store input data e from a data input/output buffer 15 into the selected memory cell in the memory array 11. Further, if the input command from the command decoder 9 is "reading", the controller 16 reads information from the selected memory cell in memory array 11, and outputs the information from the data input/output buffer 15 through a sense amplifier 12.

The burst counter 3 generates a burst transfer address from the burst length and the burst address reading order set in the mode register 8. The memory cell in the memory array 11 designated by the ROW address decoder 6 and the COLUMN address decoder 7 is selected from the ROW address and the COLUMN address. The data controller 16 is controlled by the control signal generated by the control signal generator 10. If the command to the control signal generator 10 from the command decoder 9 is a "writing" signal, the data e inputted through the data input/output buffer 15 is stored into the selected memory cell in the memory array 11.

On the other hand, if the command signal from the command decoder 9 is a "reading" signal, the information is read from the selected memory cell in memory array 11, and output from the data input/output buffer 15 through the sense amplifier 12.

FIG. 5 shows access timing in the above operation. FIG. 5 shows an example of an access operation in which the burst length has a clock length of 8, and the COLUMN address strobe (CAS) latency has a clock length of 2. A combination of control signals for execution of processing is called a command. When processing is switched from writing to reading, data on the data bus (D) is stored into the memory when the writing (WR) command is set. On the other hand, when reading (RD) information from the memory, after the execution of command, the information is output to the data bus with a clock length delay of the CAS latency. Accordingly, a period where the data bus is not used exists between the writing processing and the reading processing.

In a situation where a ROW address is set (ACT) and writing (WR) or reading (RD) processing is performed using a different ROW address, precharging processing is performed to restore the idle status, and a new ROW address is set (ACT) and writing (WR) or reading (RD) is performed. Thus, a period exists where the data bus is not used during the writing or reading processing.

SUMMARY OF THE INVENTION

As described above, the present invention provides an SDRAM memory access method to reduce the idle period where a data bus is not used caused by accessing a memory area of a different ROW address, by reservation registration and preparation for the execution of command to be executed next during a burst data writing/reading cycle, so as to increase data transfer efficiency and realize high speed burst data transfer, and to provide a simple memory interface.

BRIEF DESCRIPTION OF THE DRAWINGS

The accompanying drawings, which are a part of the specification, illustrate various embodiments of the invention and, together with the description, serve to explain the principles of the invention.

DETAILED DESCRIPTION OF THE PREFERRED EMBODIMENT

A preferred embodiment of the present invention will now be described in detail in accordance with the accompanying drawings.

Figure 1:
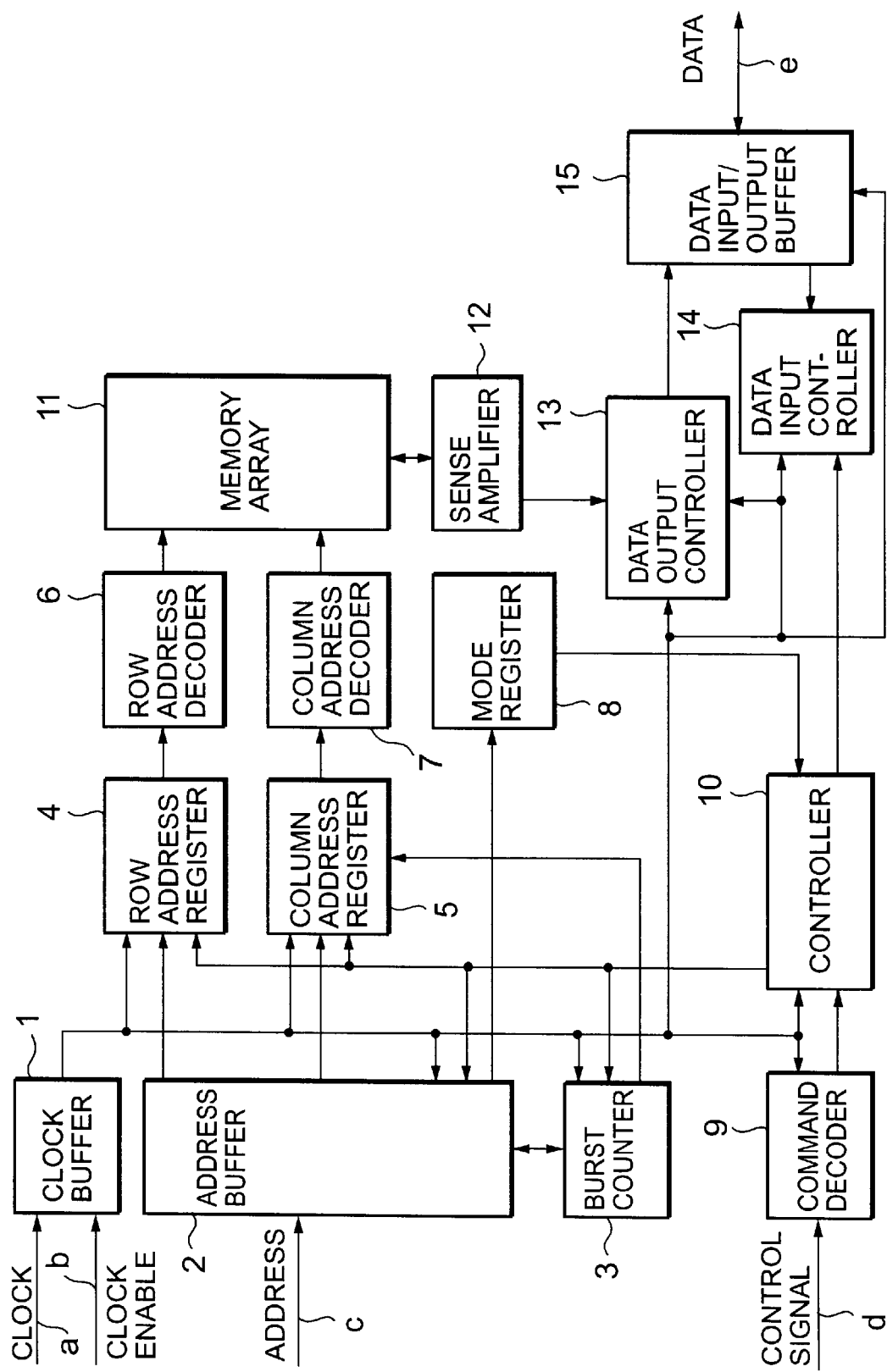
FIG. 1 is a block diagram showing a memory access system according to an embodiment of the present invention.

FIG. 1 is a block diagram of an SDRAM of a memory access system according to an embodiment of the present invention.

The memory access system has a clock buffer 1 which controls the supply of an input clock signal a and delivers the clock signal to respective elements of the SDRAM. An address signal c or operation start pre-setting signal is input where the address signal c is synchronized to address buffer 2 with a rise of a clock signal from clock buffer 1. A burst counter 3 generates a burst length address which is set upon a burst data transfer to the outside. A ROW address register 4 latches a ROW address output from the address buffer 2 to adjust timing, and a COLUMN address register 5 latches a COLUMN address output from the address buffer 2 to adjust timing. The memory access system also includes a ROW address decoder 6 which decodes the ROW address output from the ROW address register 4, and a COLUMN address decoder 7 which decodes the COLUMN address output from the COLUMN address register 5. Mode register 8 sets the operation mode of the SDRAM, and command decoder 9 interprets a control signal d and determines a command to be output to controller. Controller 10 controls the operation of the overall SDRAM in accordance with the command interpretation and determination signal output from command decoder 9. The memory access system further includes a memory array 11 having a large number of memory cells for storing data e, and a sense amplifier 12 which outputs the data e from data input controller 14 to memory array 11, and conversely outputs data from the memory array 11 to data output controller 13. The data output controller 13 which is controlled by a control signal output from the controller 10, controls data output from the sense amplifier 12. Finally, data input/output buffer 15 transfers/receives the data e between the inside and the outside of the SDRAM in synchronization with a clock signal from the clock buffer 1, and the data input controller 14, which is controlled by the control signal output from the controller 10, controls the input of data e from data input/output buffer 15.

Generally, before the SDRAM is used, its operation mode is set in the mode register 8 by an address input. The setting is held until the mode is re-set or the power is turned off. The mode set in the mode register 8 is transmitted to the controller 10, and the controller 10 generates a control signal based on the mode to thereby control the respective elements of the SDRAM.

Upon input of address a, and the control signal d, the command decoder 9 interprets the command type of the control signal d, and the controller 10 generates and outputs a control signal based on the determined command.

Figure 2:
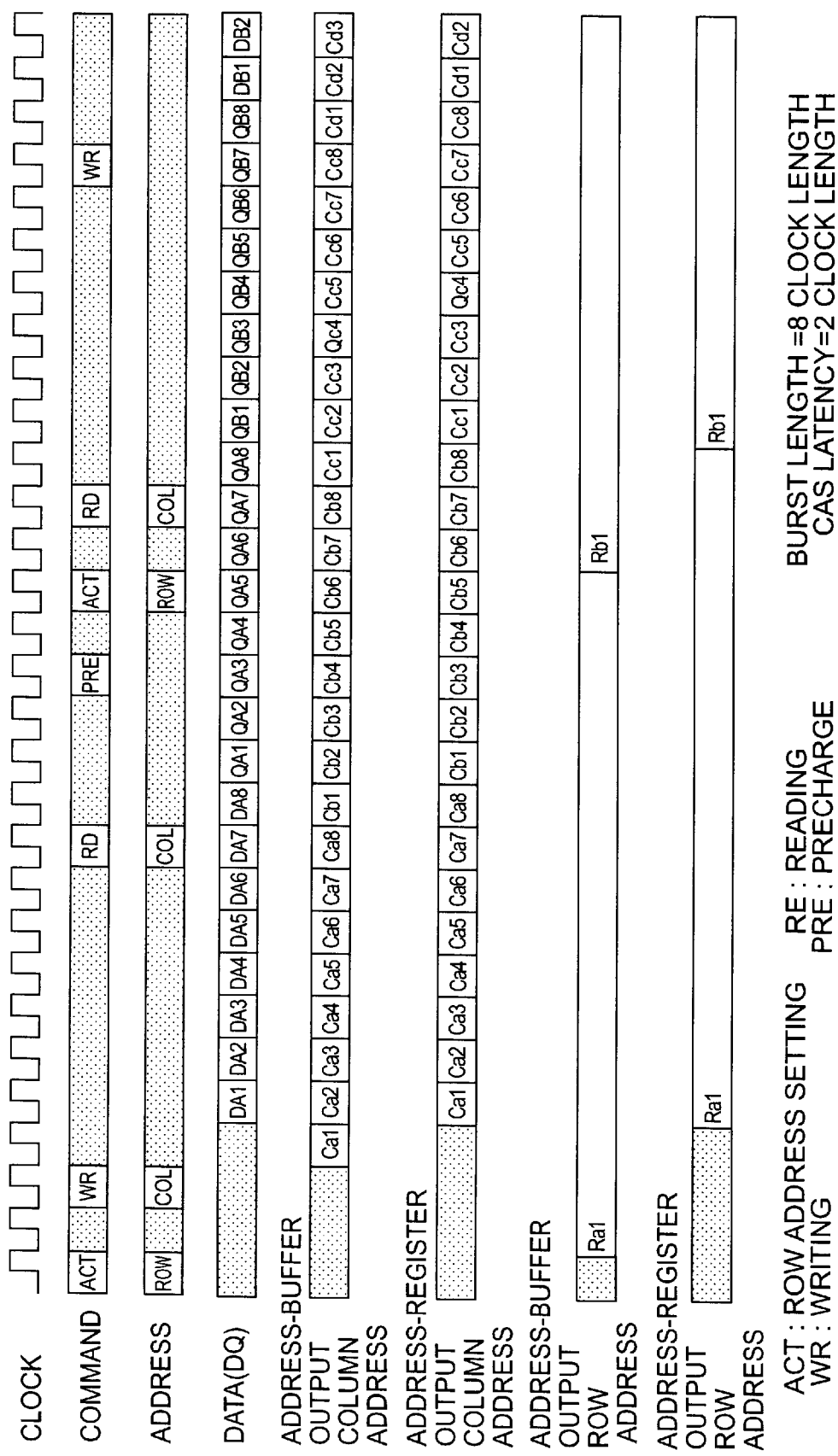
FIG. 2 is a timing chart explaining memory access operation in the memory access system in FIG. 1.

FIG. 2 is a timing chart wherein the burst length has a clock length of 8 and the COLUMN address strobe (CAS) latency has a clock length of 2.

If the command decoder 9 interprets the command signal to be a as "ROW address setting (ACT)" signal, the input address a is latched in the address buffer 2, and is subsequently output to the ROW address register 4. If the command decoder 9 interprets the command signal to be "writing (WR)" or "reading (RD)" signal, the input address a, is latched in the address buffer 2, and is output to the COLUMN address register 5.

In FIG. 2, a writing (WR) command signal is input following the ROW address setting (ACT). The ROW address is output from ROW address register 4 to ROW address decoder 6 in synchronization with the COLUMN address input upon writing. The timing-adjusted ROW address and the COLUMN address select a memory cell designated by ROW address decoder 6 and the COLUMN address decoder 7 from memory array 11.

If the data e is input with the writing command signal, the controller 10 prohibits output from the data output controller 13, and controls the data input controller 14 to receive the input data e through the data input/output buffer 15. The data e is stored from the data input controller 14 through the sense amplifier 12 into the selected memory cell in the memory array 11.

When the first burst access information is written and held, the burst counter 3 generates an address of memory location for latching the information. The generated address is latched in the COLUMN address register 5 at the next clock cycle, and is output to the COLUMN address decoder 7. Then, the data e input through the input/output buffer 15 is stored in the memory selected by the address from the memory array 11, as in the case of the first access. In the third to eighth accesses, information can be written into the memory.

Figure 3:
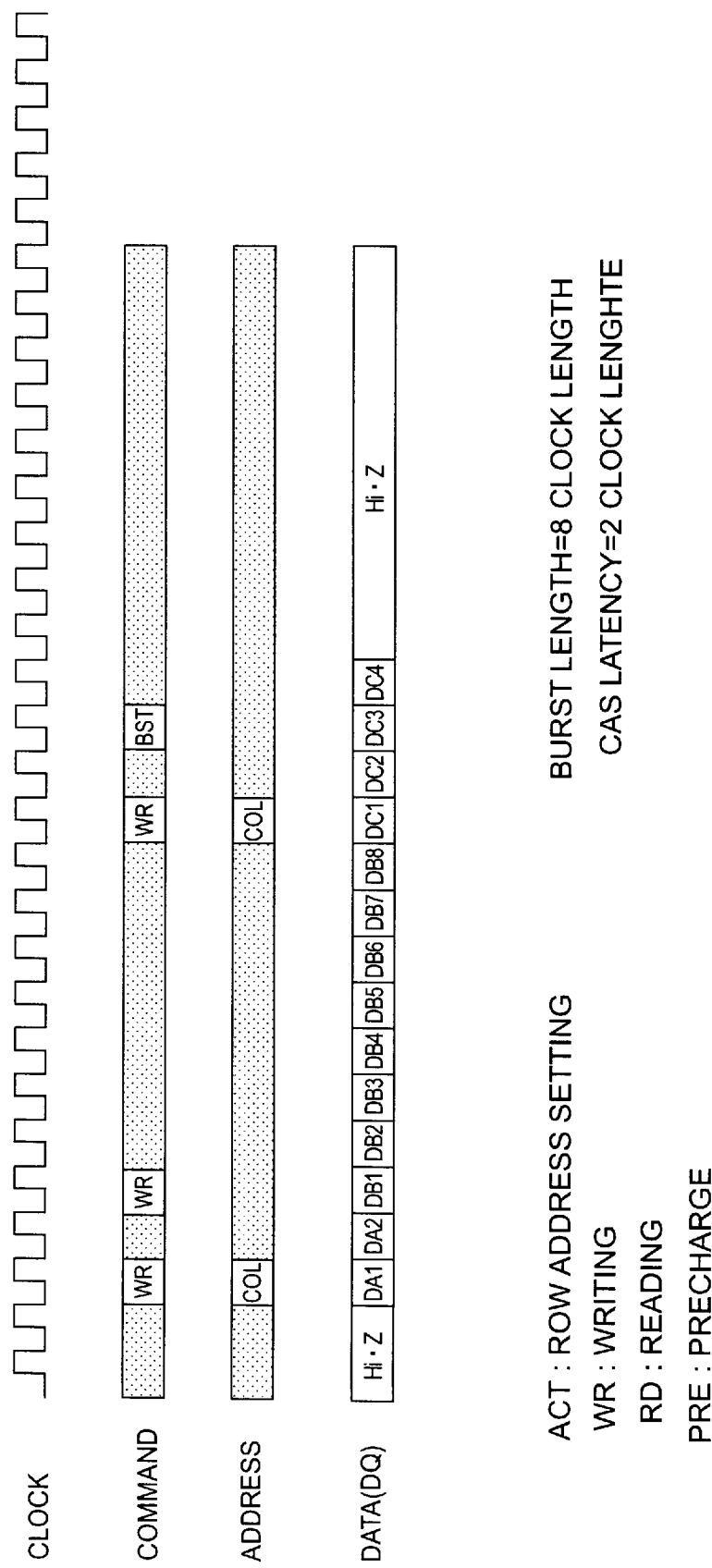
FIG. 3 is a timing chart explaining command input operation.
Figure 4:
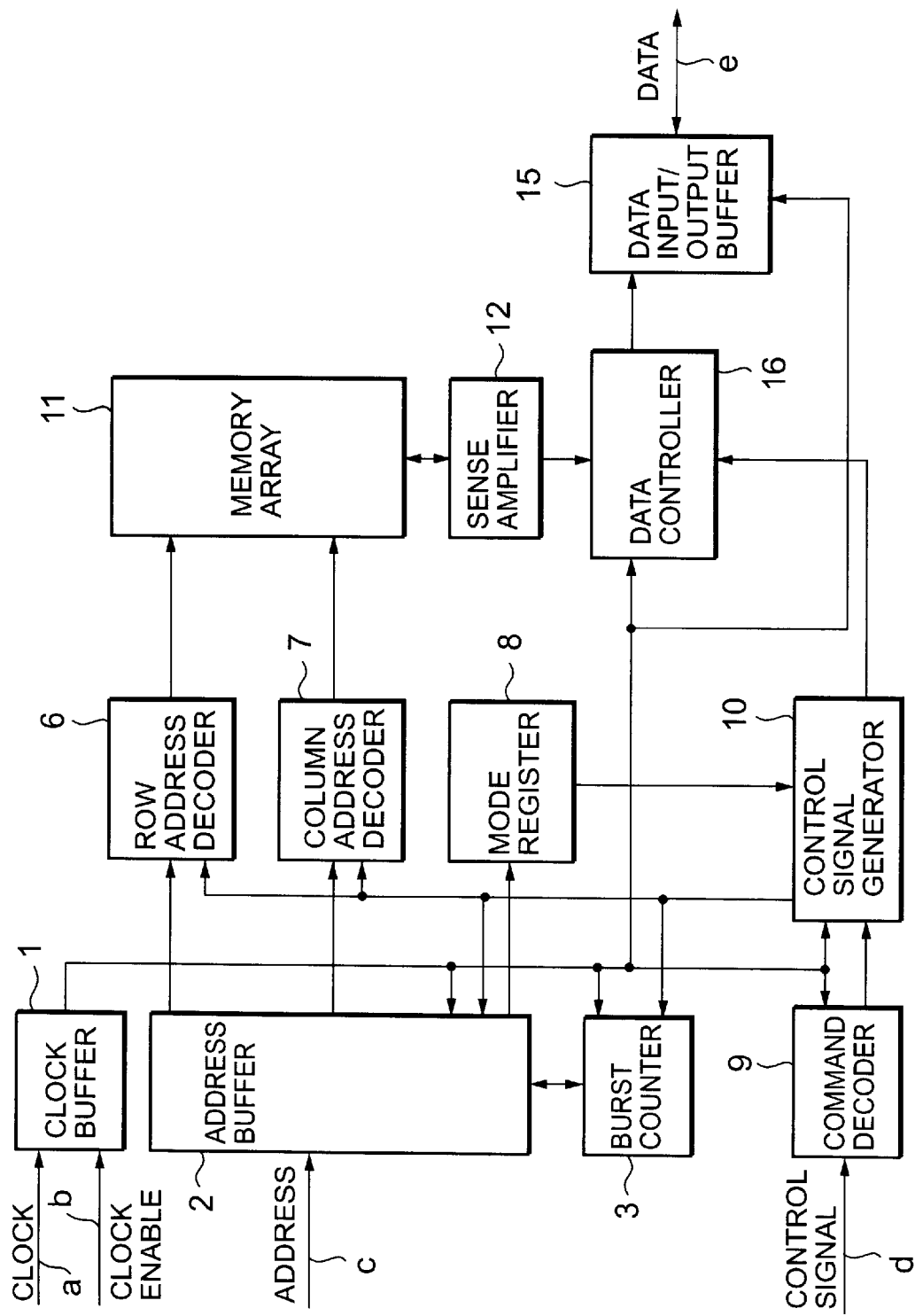
FIG. 4 is a block diagram showing the construction of a conventional SDAM.
Figure 5:
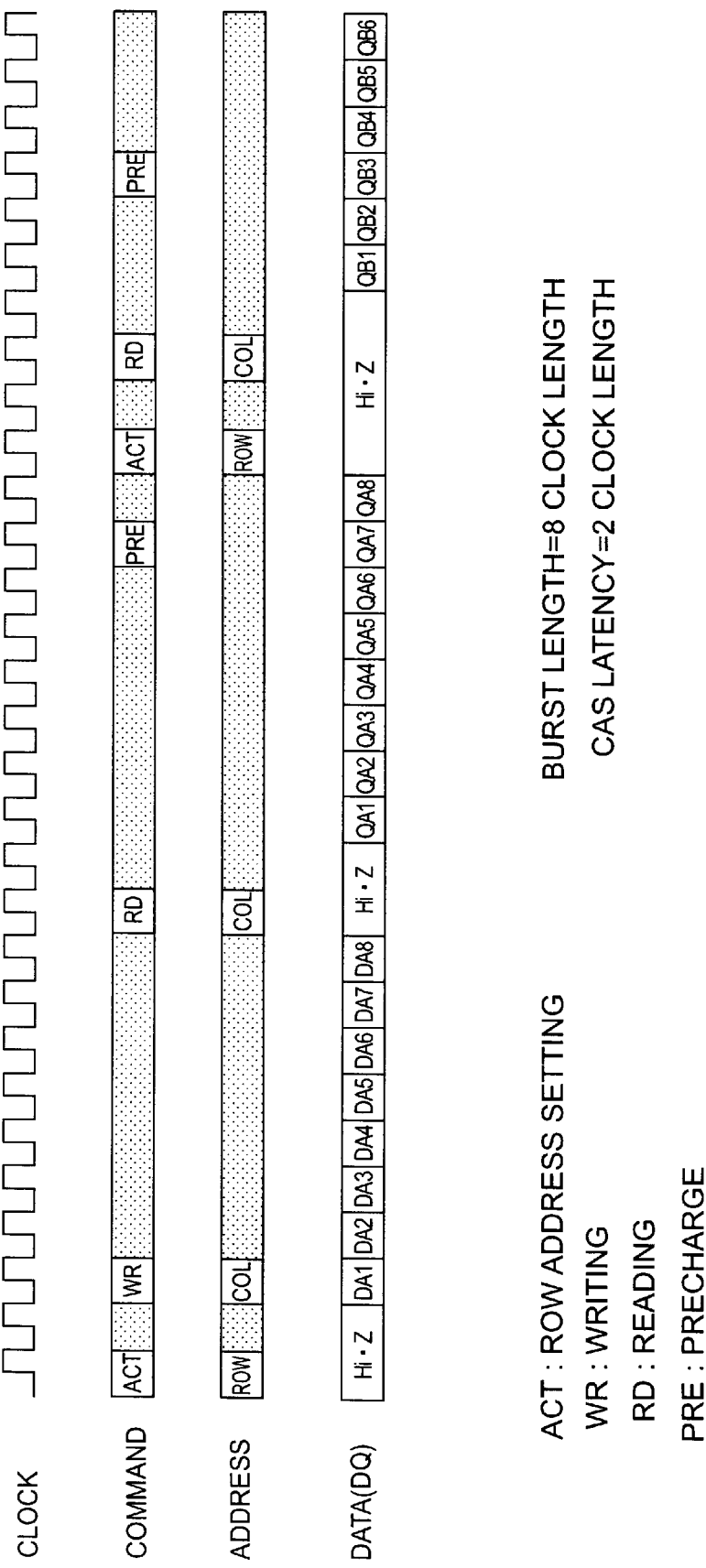
FIG. 5 is a timing chart explaining the access operation of the conventional SDRAM.

Generally, if a new command is input during a writing cycle as shown in FIG. 3, the execution stops. However, in the present invention, after a predetermined period from the input of the writing command, new input of a writing (WR) command, a reading (RD) command or a precharge (PRE) command are executed after the completion of execution command being currently executed. That is, if a command is newly input while a current command is executed, the next execution is reserved for the new command, and preparation is made for quickly executing the new command. Note that a burst transfer operation can be terminated by a burst stop (BST) command.

In FIG. 2, during a writing (WR) cycle, a new reading (RD) command is input, and the next execution is reserved for the new command. The address input at the same time as the reading command is stored as a COLUMN address in the address buffer 2. When the newly-input reading command is executed, the timing of the COLUMN address is adjusted by the COLUMN address register 5 with the ROW address, and output to the COLUMN address decoder 7. Then, a memory cell designated by the ROW address and the COLUMN address is selected from the memory array 11, and the stored information is read through the sense amplifier 12.

That is, the controller 10 controls the output from the data input controller 14 to "high impedance" based on the reading command, and constructs the data output controller 13 to output the data from the sense amplifier 12 to the data input/output buffer 15. The burst transfer from the second access with the reading (RD) command is processed similarly.

Similarly, regarding the sequence of 1) the precharging (PRE), 2) the following ROW address setting (ACT), and 3) the reading (RD) command during a reading cycle, the execution of the input command is reserved, and the execution of the command is prepared, and sequentially executed after the execution of the previous command is completed.

That is, first, a memory cell in the memory array designated by the ROW address decoder 6 and the COLUMN address decoder 7 is selected, and the ROW address and the COLUMN address timing is adjusted by the ROW address register 4 and the COLUMN address register 5, respectively. Next, the data input controller 14 and the data output controller 13 are controlled by a control signal generated by controller 10 in accordance with a command signal from the command decoder 9. If the command signal is "writing", the data e inputted through the data input/output buffer 15 is stored into the selectec memory cell in the memory array 11. Further, if the command signal is "reading", information is read from the selectec memory cell in the memory array 11, and output to the data input/output buffer 15 through the sense amplifier 12 by controlling the output of the data output controller 13.

This operation occurs by providing the mode register 8 with control information, and switching the operation of the conventional SDRAM with that of the embodiment of the present invention using the control information set in the mode register 8.

Further, in mode setting, if the latency of writing is different from that of reading, the mode setting information is input into controller 10, and the controller 10 adjust the latency by controlling the input controller 14 and the output controller 13 so as to bring the shorter latency into equivalence with the longer latency.

According to the present invention relating to writing/reading to/from a dynamic random access memory and a control method and a system thereof, during a burst writing/reading cycle, reservation registration and execution preparation are made for the next command and after the currently-executed cycle, the reserve-registered command is executed. This reduces the idle period where the data bus is not used during access to the memory area with a different ROW address, and results in a high data transfer speed.

In this burst access method, as the execution of the next command is reserved during a currently-executed cycle, a command input range is widened, and thus creating a less rigid input timing.

Further, when the latency of writing and reading are different from each other, their respective latencies are brought into equivalence. As a result, the idle period where the data bus is not effectively used is solved, and the memory data interface can be simplified.

Using the access method and system as taught above, efficient and high-speed memory access can be provided in an application with a large number of continuous random writing and reading operations.

As described above, according to the present invention, upon access to a memory area with a different ROW address, an idle period where the data bus is not used is reduced, and a high data transfer speed can be attained. Further, when the latency of writing and reading are different from each other. Their respective latencies are brought into equivalence.

As many different embodiments of the present invention can be made without departing from the spirit and scope thereof, it is to be understood that the invention is not limited to the specific embodiments described above.

What is claimed is:

1. A memory access method comprising:
    a step of discriminating an input command;
    a step of, after discrimination of ROW address setting from said command, latching an input address as a ROW address for a predetermined period;
    a step of, if writing or reading is discriminated from said command, latching an input address as a COLUMN address for a predetermined period; and
    a step of selecting a memory cell based on the held ROW and COLUMN addresses.

2. The memory access method according to claim 1, further comprising a step of, when writing is performed in accordance with said command, inputting a new reading command and reserving execution of the newly input command during a writing cycle.

3. The memory access method according to claim 1, further comprising a step of, if latency of the writing and that of the reading have different values, adjusting a shorter latency to a longer latency.

4. The memory access method according to claim 1, wherein the memory is a synchronous DRAM (Dynamic Random Access Memory).

5. A memory access system comprising:
    means for discriminating an input command;
    first holding means for, after discrimination of ROW address setting from said command, latching an input address as a ROW address for a predetermined period;
    second holding means for, if writing or reading is discriminated from said command, latching an input address as a COLUMN address for a predetermined period; and
    selection means for selecting a memory cell based on the held ROW and COLUMN addresses.

6. The memory access system according to claim 5, wherein the memory is a synchronous DRAM (Dynamic Random Access Memory).

7. A synchronous DRAM (Dynamic Random Access Memory) access system comprising:
    an address buffer that reads an address signal or operation start pre-setting signal from outside in synchronization with an input clock;
    a burst counter that generates an address of a burst length set upon burst data transfer with the outside;
    a ROW address register that performs timing adjustment by latching a ROW address outputted from said address buffer;
    a COLUMN address register that performs timing adjustment by latching a COLUMN address outputted from said address buffer;
    a ROW address decoder that decodes the ROW address outputted from said ROW address register;
    a COLUMN address decoder that decodes the COLUMN address outputted from said COLUMN address register;

a mode register that sets an operation mode of the DRAM by said operation start pre-setting signal;

a command decoder that interprets and discriminates a command by a control signal from the outside;

a controller that controls an overall operation of the DRAM in accordance with a command interpretation and discrimination result signal outputted from said command decoder;

a memory array having a large number of memory cells for holding data for burst data transfer with the outside;

a data output controller, controlled by a control signal from said controller, that controls output of said data from said memory array;

a data input/output buffer for transmission/reception of said data between the outside and inside, in synchronization with said input clock; and a data input controller, controlled by the control signal outputted from said controller, that controls input of said data from said input/output buffer.

* * * * *